United States Patent
Frese et al.

[11] Patent Number: 5,708,362
[45] Date of Patent: Jan. 13, 1998

[54] MAGNET ARRANGEMENT FOR A DIAGNOSTIC MAGNETIC RESONANCE APPARATUS

[75] Inventors: Georg Frese, Herzogenaurach; Michael Sellers, Erlangen, both of Germany

[73] Assignee: Siemens Aktiengesellschaft, Munich, Germany

[21] Appl. No.: 740,488

[22] Filed: Oct. 30, 1996

[30] Foreign Application Priority Data

Nov. 16, 1995 [DE] Germany ............ 195 42 812.9

[51] Int. Cl.⁶ .................................................. G01V 3/00
[52] U.S. Cl. ........................................ 324/319; 324/320
[58] Field of Search ............................ 324/319, 320, 324/318, 322, 300; 335/216, 299; 128/653.5

[56] References Cited

U.S. PATENT DOCUMENTS

| | | | |
|---|---|---|---|
| 4,339,718 | 7/1982 | Bull et al. | 324/320 |
| 4,875,485 | 10/1989 | Matsutani | 324/319 |
| 4,902,995 | 2/1990 | Vermilyea | 335/216 |
| 5,023,554 | 6/1991 | Cho et al. | 324/309 |
| 5,198,769 | 3/1993 | Frese et al. | 324/318 |
| 5,345,208 | 9/1994 | Dorri et al. | 335/301 |
| 5,389,879 | 2/1995 | Pulyer | 324/320 |
| 5,410,287 | 4/1995 | Laskaris et al. | 335/216 |
| 5,448,214 | 9/1995 | Laskaris | 324/319 |

FOREIGN PATENT DOCUMENTS

| | | |
|---|---|---|
| 0 186 998 | 7/1986 | European Pat. Off. . |
| 0 424 808 | 5/1991 | European Pat. Off. . |
| 0 517 452 | 12/1992 | European Pat. Off. . |
| 39 07 927 | 9/1990 | Germany . |

*Primary Examiner*—Louis M. Arana
*Attorney, Agent, or Firm*—Hill, Steadman & Simpson

[57] ABSTRACT

A magnet arrangement for a diagnostic magnetic resonance apparatus has an electromagnet arrangement for the production of a homogeneous magnetic field oriented along an axis in an imaging volume. The electromagnet arrangement has first and second windings arranged opposite one another at a distance from one another, transverse to the axis. In relation to the axis, an axial access and a transverse access to the imaging volume are present between the first and second windings.

17 Claims, 6 Drawing Sheets

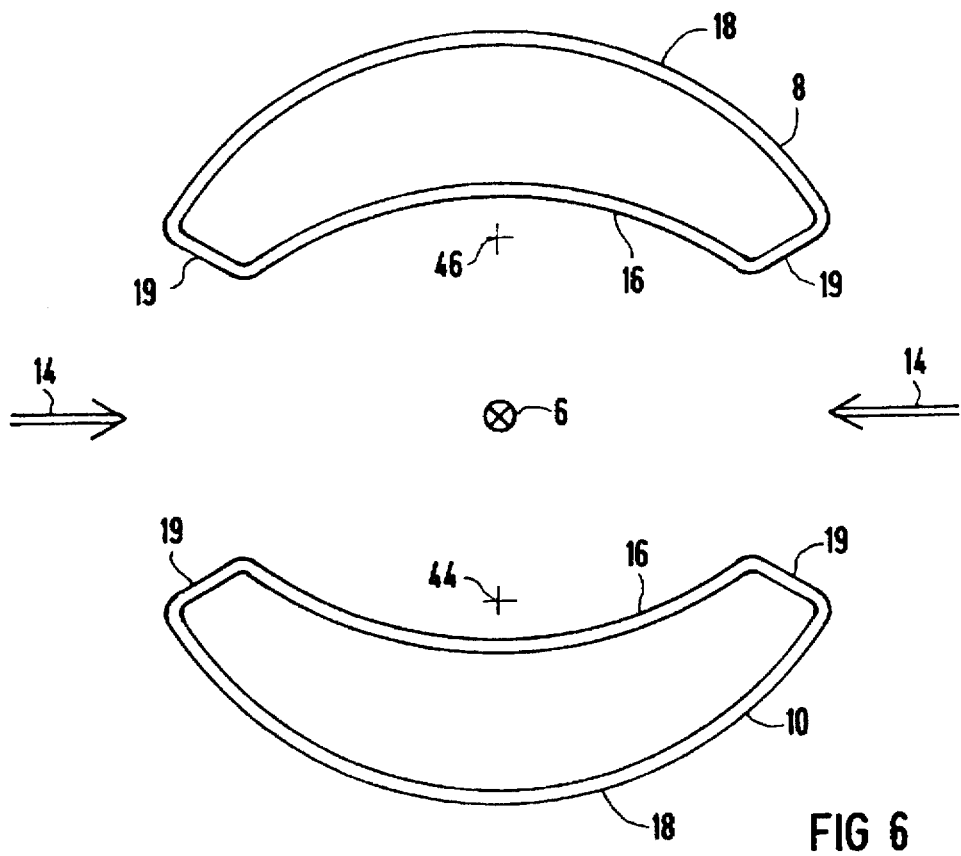
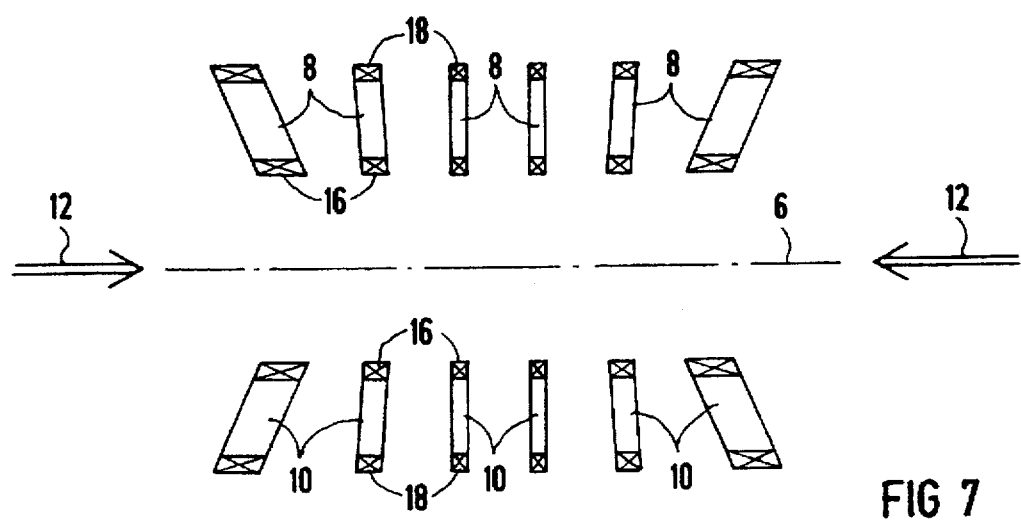
FIG 6
FIG 7

MAGNET ARRANGEMENT FOR A DIAGNOSTIC MAGNETIC RESONANCE APPARATUS

BACKGROUND OF THE INVENTION

1. Field of the Invention

The present invention is directed to a magnet arrangement for a diagnostic magnetic resonance apparatus with an electromagnet arrangement for the production of a homogeneous magnetic field oriented along an axis in an imaging volume, having a transverse access to the imaging volume in relation to the imaging volume axis.

2. Description of the Prior Art

Almost every manufacturer of diagnostic magnetic resonance apparatus today offers open systems. Usually, these are low-field systems with two pole shoes that produce a chronologically constant main magnetic field, whose homogeneous field region determines the imaging volume. The systems have a patient access and offer an additional access possibility to the imaging volume for a physician or examiner. The pole shoes are connected with one another with a flux feedback (magnetic return) that can be H-shaped (i.e. symmetrical) or C-shaped. As magnetic drives, coils or permanent magnets are used, which are located in the pole shoes themselves or in the return.

A magnet arrangement of the type named above is described in U.S. Pat No. 5,345,208. Pole shoes arranged opposite one another are connected with one another via a C-shaped magnetic return. An electromagnet arrangement in the form of a superconducting coil is located in the return.

A magnet arrangement of the type described above is also known from U.S. Pat. No. 4,902,995. In this known arrangement, the main magnetic field is produced by two superconducting coils that are arranged opposite one another and are of similar construction.

SUMMARY OF THE INVENTION

An object of the present invention is to provide an open magnet arrangement by means of which a high magnetic field strength can be produced in an imaging volume.

The above object is achieved in an open magnet arrangement having an electromagnet arrangement having first and second windings, arranged opposite one another at a distance from one another transverse to the imaging volume axis, and wherein axial access to the imaging volume is fashioned between the first and second windings in relation to the imaging volume axis. By partitioning of the electromagnet arrangement into two windings arranged opposite one another, a high field strength, previously achievable for the most part only with closed systems, can also be produced in an open system.

In one embodiment the first and second windings are each formed of first and second winding segments, which are oriented in a circumferential direction of the imaging volume perpendicular to the axis. The respective first (inner) winding segments are arranged closer to the imaging volume than are the respective second winding segments. The respective first winding segments produce the useable field in the imaging volume, oriented along the aforementioned axis. The respective second (outer) winding segments outwardly shield the magnetic field at least in part, so that the stray field decays with a similar strength as in an actively shielded conventional magnet arrangement.

In a further embodiment, the first winding segments are formed in a curved fashion, with a concave side of each first winding segment facing the imaging volume. The axial access is indeed thereby somewhat limited by this structure, but the magnetic field is homogenized in the transverse direction.

In another embodiment, each pair of first and second windings segments forms a coil. The first winding is composed of a plurality of first coils and the second winding is composed of a plurality of second coils, with the first and second coils being arranged opposite one another. If the ampere-winding number of the coils increases from the center outward, the magnetic field can be homogenized in the axial direction.

In a further version of this embodiment the respective winding segments of different coils can be fashioned with different lengths. The size of the homogenous imaging volume can thereby be improved, particularly in the axial direction.

In order to improve the shielding effect of the winding segments at the axial access, in another embodiment a second plurality of windings is arranged on surfaces oriented diagonally to the first axis.

Likewise, for improving the homogeneity in the region of the axial access, in another embodiment at least one circularly annular coil is arranged on at least one frontal side of the first and second windings, coaxial with the imaging volume axis. The lateral access for the physician is maintained.

In a further embodiment for support and for the reception of the weight and/or to resist Lorentz forces, the first and second windings are connected with one another via a C-shaped support, arranged outside the imaging volume.

In an alternative construction, for support the first windings are connected with the second windings via columnar stays arranged on both sides of the accesses. This support is particularly advantageous in a magnet arrangement with additional outer circularly annular coils.

For increasing the strength of the field, in a further embodiment the first and second windings are wrapped on a ferromagnetic carrier.

DESCRIPTION OF THE DRAWINGS

FIG. 6 is a top view of an alternative form of the windings in a magnet arrangement constructed in accordance with the principles of the present invention.

Fig. 7 is a side sectional view of a magnet arrangement with an improved shielding in the region of the axial access constructed in accordance with the principles of the present invention.

DESCRIPTION OF THE PREFERRED EMBODIMENTS

Figure 1:
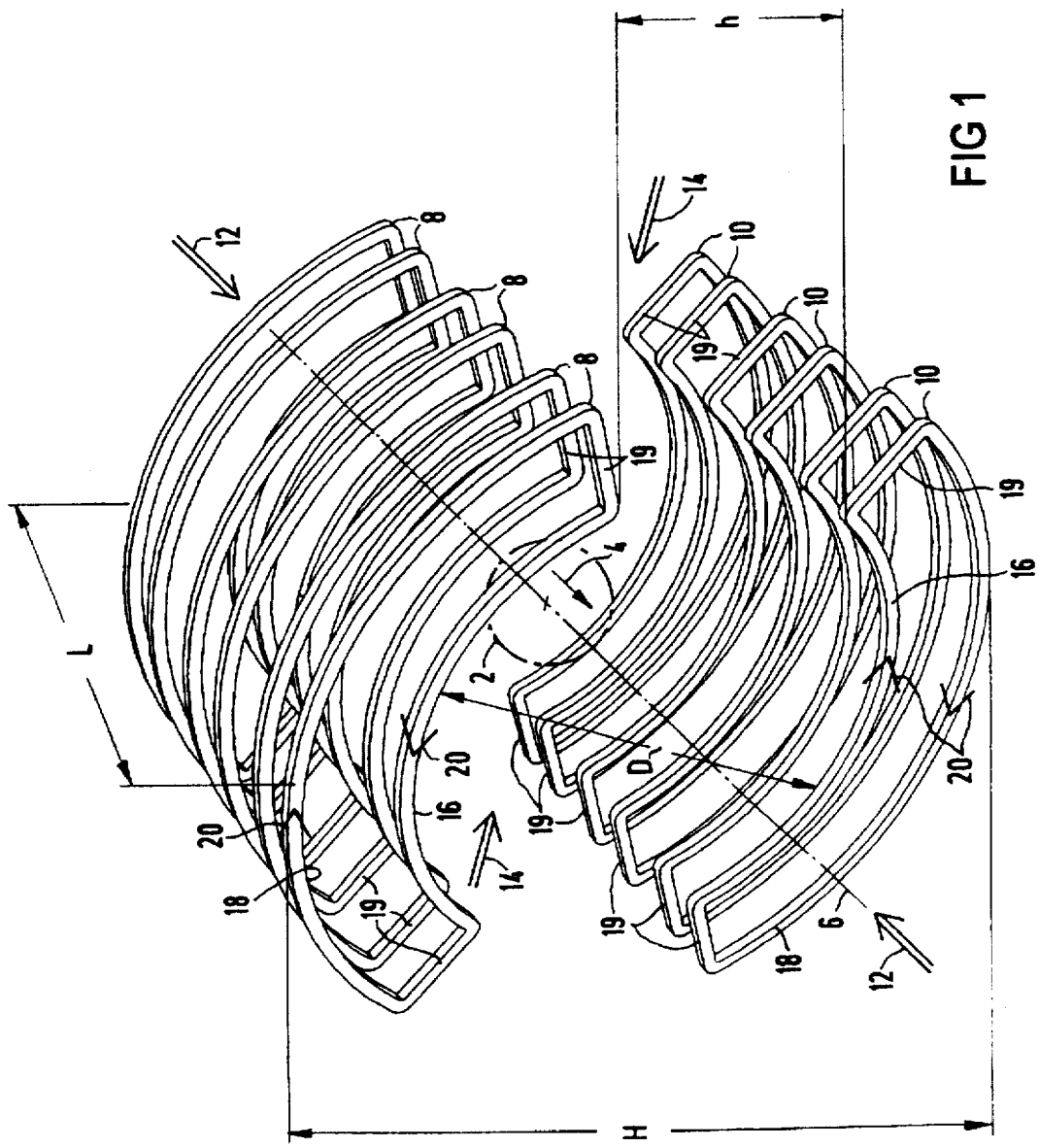
FIG. 1 is a perspective view of an open magnet arrangement with coils arranged opposite one another constructed in accordance with the principles of the present invention.

FIG. 1 schematically shows a magnet arrangement with electromagnets for a diagnostic magnetic resonance apparatus. Upon excitation with a direct current, the magnet arrangement produces an essentially homogeneous magnetic field Bo in its center in an imaging volume 2. The magnetic field Bo, symbolized in FIG. 1 by an arrow, is oriented parallel to an axis 6. The axis 6 is also an axis of symmetry of the electromagnet arrangement.

The electromagnet arrangement includes six first coils 8 and six second coils 10, each having several hundred first and second windings, wrapped on a carrier (not shown). The carrier can be fashioned as an iron core for amplification of the magnetic field Bo in the imaging volume 2. The first and second coils 8 and 10 (and thus the first and second windings thereof) are arranged opposite one another transverse to the axis 6. An axial access 12, and transversely thereto a transverse access 14, are thus created in relation to the axis 6. The axial access 12 is fashioned for bringing the patient into the imaging volume 2, while the transverse access 14 gives a physician the possibility of carrying out interventions on the patient during a magnetic resonance examination.

The first and second windings in the first and second coils 8 and 10, respectively comprise first and second winding segments 16 and 18, which are oriented in a circumferential direction of the imaging volume 2, perpendicular to the axis 6. The winding segments 16 and 18 are respectively connected with one another via radial conductor pieces 19. The first winding segments 16 are arranged closer to the imaging volume 2 than are the second winding segments 18. The first and second winding segments 16 and 18 are formed in a curved fashion, with their concave side facing the imaging volume 2. In the circumferential direction, they cover an angle about the axis 6 of preferably about 120°.

Each coil 8 and 10 thus has a shape conforming to the outline (periphery) of a sector of a circle.

The individual coils 8 and 10 are connected to a supply of direct current (not shown), causing current to flow in the individual windings, e.g., in the direction of the arrows 20, shown in two of the coils 8 and 10. Current flows through the other coils 8 and 10 in the same respective directions, so that in all first winding segments 16 a current flows around the axis 6 in a counterclockwise direction, and in all second winding segments 18 a current flows in a clockwise direction. The radial spacing of the first and second winding segments 16 and 18 from one another determines the outward shielding effect for the magnet field as well as the strength of the magnetic field Bo in the imaging volume 2. From a theoretical point of view, the radial distance should be as small as possible, in order to keep the construction size within reasonable limits; however, it should be as large as possible, in order not to reduce the usable field in the imaging volume 2 too strongly. A compromise between these two opposed requirements must be selected.

In a superconducting embodiment, the coils 8 and 10 are installed in a cryostatic temperature regulator (not shown). Typical dimensions of the superconducting magnet arrangement then result, with which a field strength of e.g. 0.7 T can be produced in the imaging volume 2:

axial length L=1.50 m,
height H=1.80 m,
inner diameter D=1 m, and
height of the transverse opening h=0.5 m.

Figure 2:
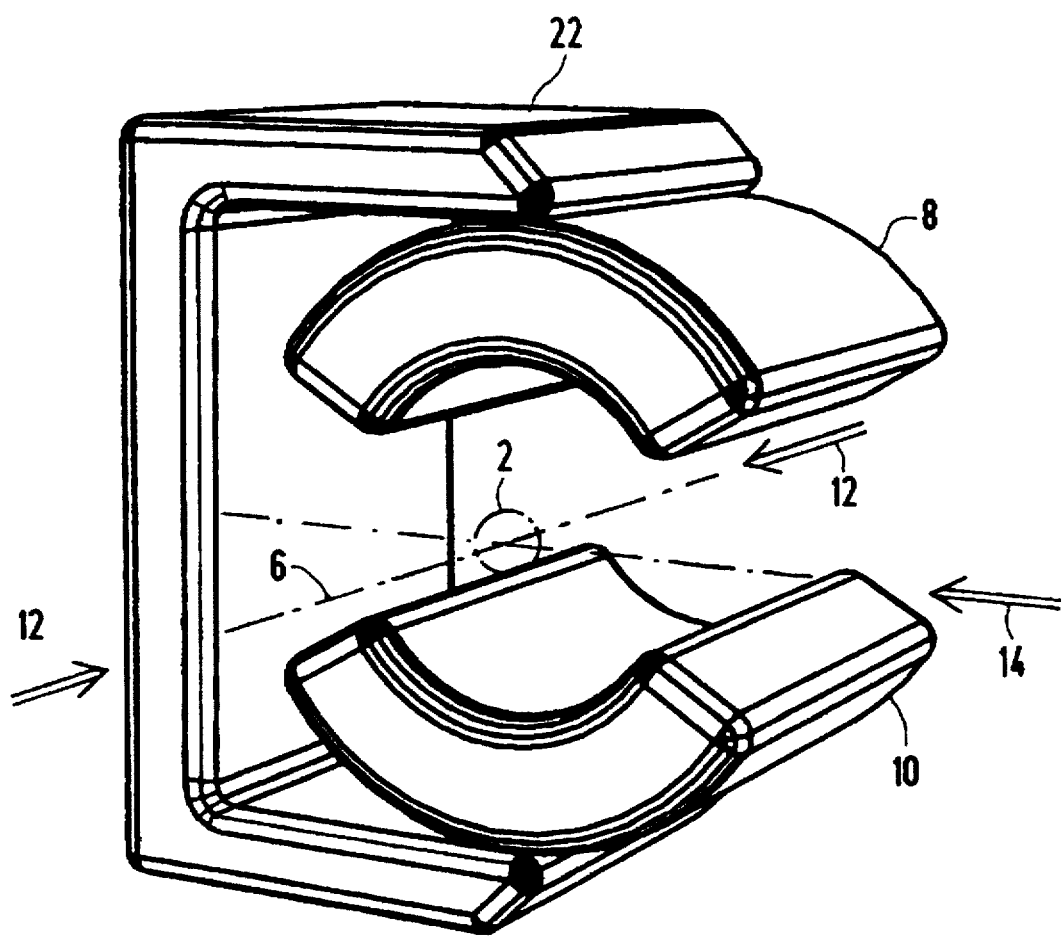
FIG. 2 shows an open magnet arrangement with a C-shaped stand constructed in accordance with the principles of the present invention.

FIG. 2 shows, in a perspective view, a construction of the magnet arrangement in which the two coils arranged opposite one another in each pair are connected with one another by a C-shaped stand 22. The coils 8 and 10 are thereby respectively constructively combined into coil packets arranged opposite one another. The C-shaped stand 22 allows access from three sides to the imaging volume 2. In a superconducting embodiment, the coils 8 and 10 are located in a cryostat, and the stand 22 can be a part of the cryostat (not shown).

Figure 3:
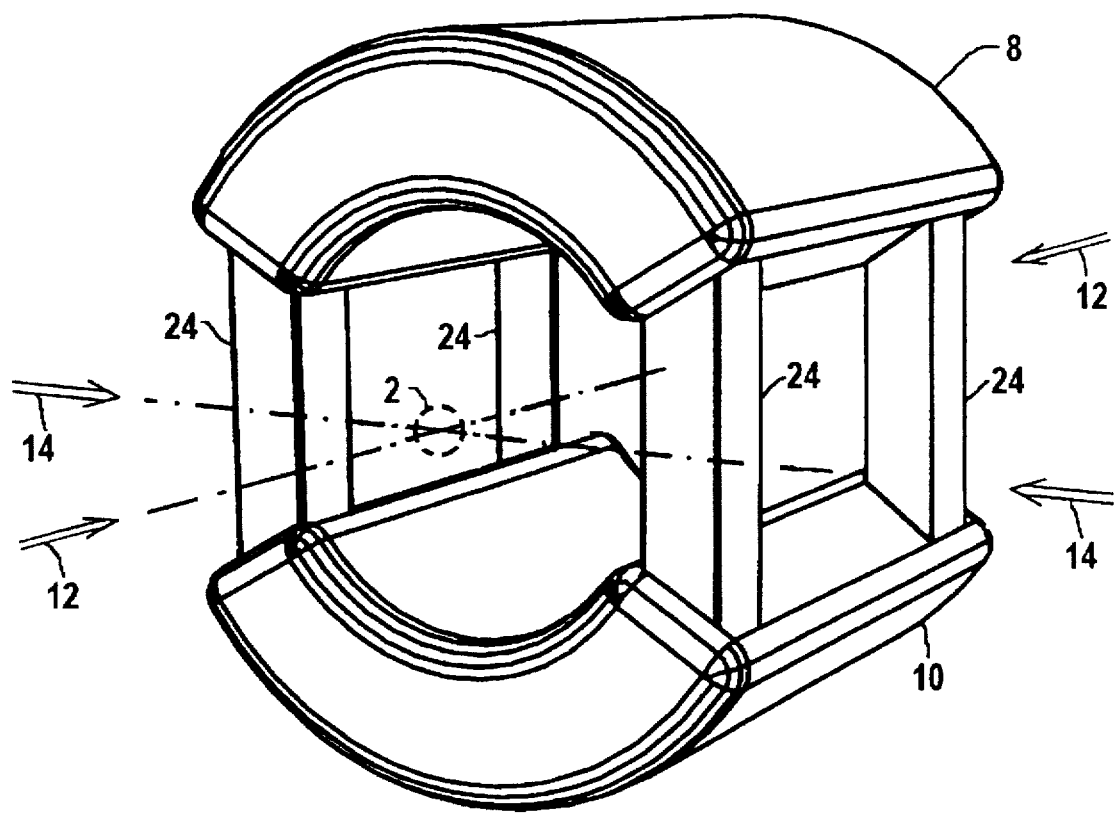
FIG. 3 shows an open magnet arrangement with a columnar support constructed in accordance with the principles of the present invention.

In contrast to FIG. 2, FIG. 3 shows a constructive embodiment with access from four sides to the imaging volume 2. The first and second coils 8 and 10, respectively combined into a coil packet, are here connected with one another via columnar stays 24 arranged at the ends.

Figure 4:
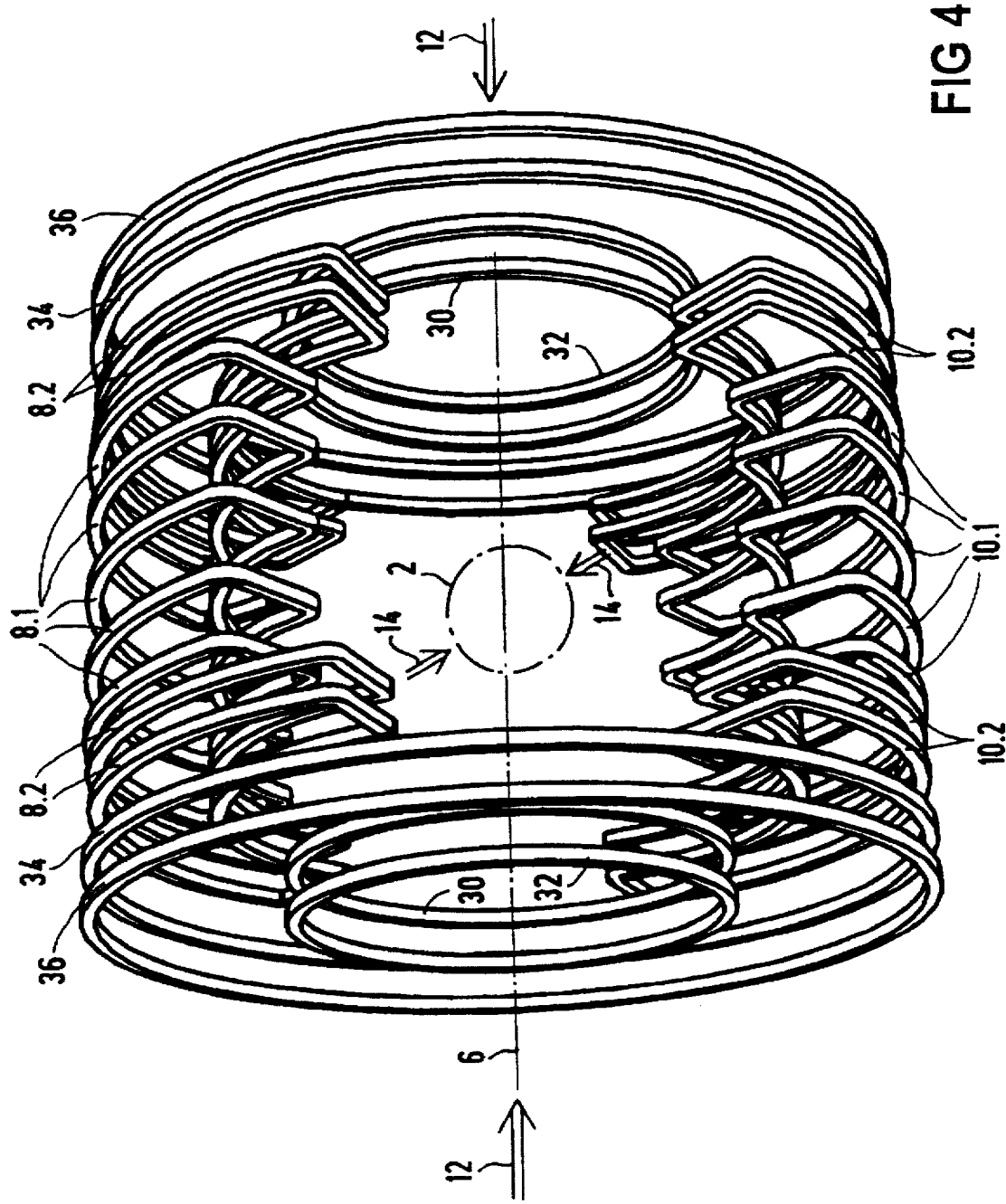
FIG. 4 shows an open magnet arrangement with an optimally large imaging volume constructed in accordance with the principles of the present invention.

FIG. 4 illustrates the principle of a magnet arrangement in which the imaging volume 2 is enlarged, in particular in the axial direction. For this purpose, two circularly annular coils 30 and 32 are respectively arranged on the frontal ends of the first and second coils 8 and 10 which are arranged opposite one another. The diameter of the coils 30 and 32 can be smaller than the diameter shown in FIG. 1, which is determined by the inner winding segments of the coils 8 and 10. The coils 30 and 32 are likewise connected with a supply of current (not shown), and produce a flow of current in the same direction as in the first winding segments 16 of the coils 8 and 10. The coils 30 and 32 that produce the usable field are surrounded by shielding coils 34 and 36.

For enlarging the transverse access 14, the inner five coils 8.1 and 10.1 only cover an angle of 90°, which is less than that of the two outer coils 8.2 and 10.2 connected thereto. For the magnet arrangement shown in FIG. 4, the columnar support at the ends of the coil packets, already shown in FIG. 3, are particularly suited.

Figure 5:
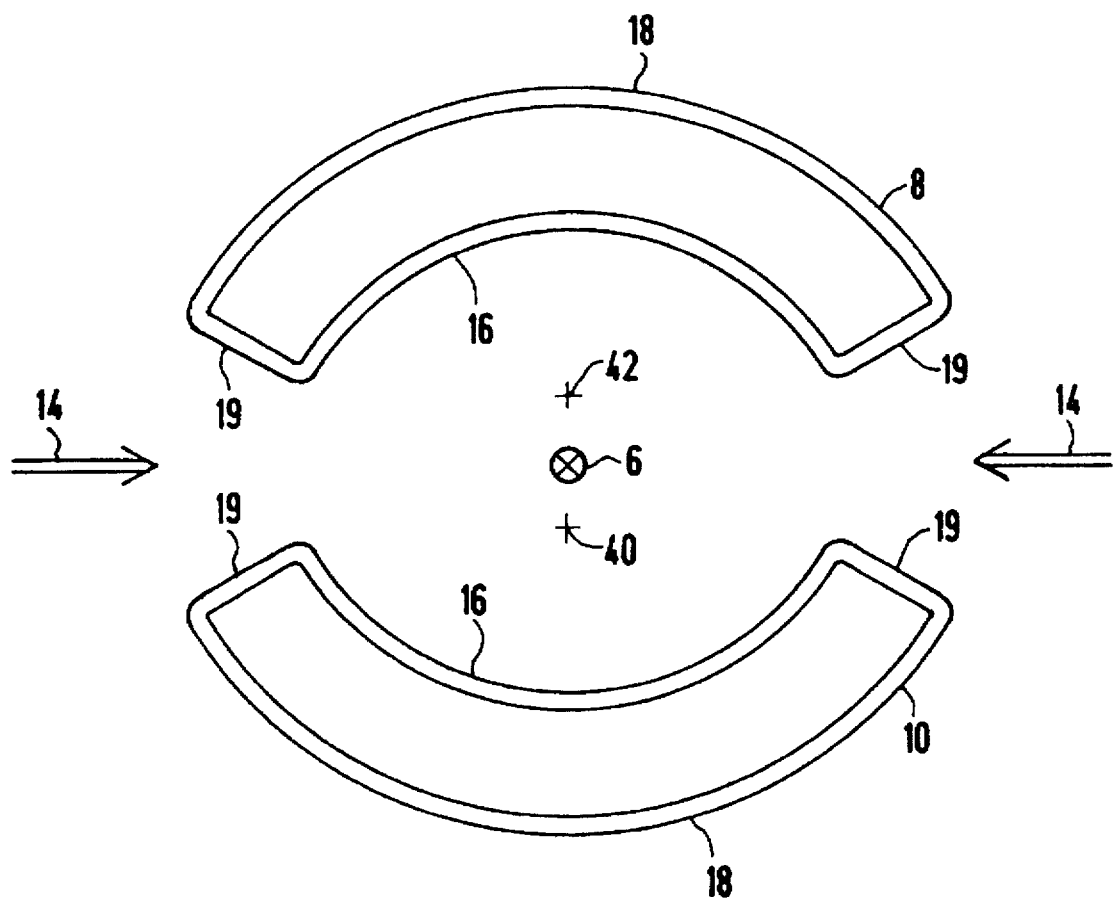
FIG. 5 is a top view of a further embodiment of the windings of an open magnet arrangement constructed in accordance with the principles of the present invention.

FIG. 5 shows an arrangement of the first and second coils 8 and 10, in the midpoint of the circularly annular segments formed by the windings is not displaced along the axis 6, but instead is displaced transverse to the access 14 in the vertical direction. The homogeneity of the magnetic field Bo in the transverse direction, i.e. toward the transverse accesses 14, is thereby improved. The midpoint of the curvature of the coil 8, shaped as a segment of a circular ring, is designated 40, and the midpoint of the curvature of the coil 10, shaped in the same way, is designated 42.

The shape of the windings of the first and second coils 8 and 10, shown in FIG. 6, also improves the homogeneity in the transverse direction in the examination chamber. In the embodiment of FIG. 6, however, only the midpoints of the curvatures of the inner first winding segments 16 are arranged so as to be displaced transversely to the transverse access 14 of the axis 6. Thus, the midpoint of the curvature of the first winding segments of the upper coil 8 is designated 44, and the midpoint of the curvature of the first winding segments 16 of the lower coil 10 is designated 46. The midpoint of the curvature of the outer second winding segments 18, shaped in a circular arc, lies on the axis 6.

FIG. 7 shows, in a side sectional view, the principle of a magnet arrangement, wherein only middle coils 8.3 and 10.3 are arranged in planes oriented perpendicularly to the first axis 6. In contrast, outer coils 8.4 and 10.4 are arranged on surfaces oriented diagonally to the first axis 6. The outward shielding effect of the magnet arrangement at the axial accesses is improved by the diagonal orientation, Although modifications and changes may be suggested by those skilled in the art, it is the intention of the inventors to embody within the patent warranted hereon all changes and modifications as reasonably and properly come within the scope of their contribution to the art.

We claim as our invention:

1. A magnet arrangement for a diagnostic magnetic resonance apparatus comprising:

electromagnet means for producing a homogenous magnetic field oriented along an axis in an imaging volume; and said electromagnet means comprising first and second windings each curved around said axis and disposed opposite from each other and at a distance from each other transverse to said axis, said first and second windings being oriented for defining an axial access to said imaging volume relative to said axis and a transverse access to said imaging volume relative to said axis.

2. A magnet arrangement as claimed in claim 1 wherein each of said first and second windings comprises first and second winding segments oriented along a circumferential direction of said imaging volume perpendicular to said axis, and in each of said first and second windings said first winding segment being disposed closer to said imaging volume than said second winding segment.

3. A magnet arrangement as claimed in claim 2 wherein each first winding segment has a curved shape with a concave side of said first winding segment facing said imaging volume.

4. A magnet arrangement as claimed in claim 2 wherein each second winding segment has a curved shape with a concave side of second first winding segment facing said imaging volume.

5. A magnet arrangement as claimed in claim 1 wherein, in each of said first and second windings, each of said first and second winding segments has a curved shape.

6. A magnet arrangement as claimed in claim 5 wherein, in each of said first and second windings, said first and second winding segments are disposed parallel to each other.

7. A magnet arrangement as claimed in claim 1 wherein each of said first and second windings has a shape comprising an outline of a sector of a circle.

8. A magnet arrangement as claimed in claim 1 wherein said first windings comprise a plurality of first coils and wherein said second windings comprise a plurality of second coils, said pluralities of first and second coils respectively being disposed on opposite sides of said imaging volume.

9. A magnet arrangement as claimed in claim 8 wherein each of said first coils has one of said second coils in registry therewith.

10. A magnet arrangement as claimed in claim 9 wherein said electromagnetic means comprises electromagnetic means for producing said homogenous magnetic field oriented along a horizontal axis.

11. A magnet arrangement as claimed in claim 9 wherein said plurality of first coils includes a plurality of outer first coils and a plurality of inner first coils relative to said horizontal axis, said inner first coils having a shorter length than said outer first coils, and wherein said plurality of second coils includes a plurality of outer second coils and a plurality of inner second coils relative to said horizontal axis, said inner second coils having a shorter length than said outer second coils.

12. A magnet arrangement as claimed 10 wherein a first number said first coils and second are respectively disposed in a plurality of planes oriented substantially perpendicularly to said horizontal axis.

13. A magnet arrangement as claimed in claim 12 wherein a second number of said first and second coils are respectively disposed in a plurality of further surfaces oriented diagonally to said horizontal axis.

14. A magnet arrangement as claimed in claim 10 wherein said electromagnet means has a front side at one end of said horizontal axis, and further comprising at least one circularly annular coil disposed at said front side, adjacent one of said first coils and adjacent one of said second coils, coaxially on said horizontal axis.

15. A magnet arrangement as claimed in claim 1 further comprising a C-shaped stand, disposed outside said imaging volume, connecting said first and second windings.

16. A magnet arrangement as claimed in claim 1 comprising a plurality of columnar stands, disposed on opposite sides of each of said axial access and said transverse access, and connecting said first and second windings.

17. A magnet arrangement as claimed in claim 1 further comprising a first ferromagnetic carrier on which said first windings are wound and a second ferromagnetic carrier on which said second windings are wound.

\* \* \* \* \*